US006461792B1

(12) United States Patent
Kawamura et al.

(10) Patent No.: US 6,461,792 B1
(45) Date of Patent: Oct. 8, 2002

(54) LITHOGRAPHIC PRINTING PLATE PRECURSOR

(75) Inventors: Koichi Kawamura; Tadahiro Sorori; Sumiaki Yamasaki, all of Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 53 days.

(21) Appl. No.: 09/637,885

(22) Filed: Aug. 14, 2000

(30) Foreign Application Priority Data

Aug. 12, 1999 (JP) .......................................... 11-228619
Dec. 7, 1999 (JP) .......................................... 11-347782

(51) Int. Cl.[7] .......................... G03C 1/74; G03C 1/795; G03F 7/038; G03F 7/09; B41N 3/00

(52) U.S. Cl. .................... 430/271.1; 430/302; 430/303; 430/270.1; 101/460; 101/462

(58) Field of Search .......................... 430/271.1, 270.1, 430/302, 303; 101/460, 462

(56) References Cited

U.S. PATENT DOCUMENTS 4,275,092 A * 6/1981 Nakayama et al. ......... 430/302
5,731,123 A * 3/1998 Kawamura et al. ......... 430/176
6,165,691 A * 12/2000 Damme et al. ............. 430/303

FOREIGN PATENT DOCUMENTS

DE 27 34 508 A 2/1978
EP 0 903 224 A 3/1999
JP 54 074102 A 6/1979
JP 01 238935 A 9/1989

* cited by examiner

*Primary Examiner*—Janet Baxter
*Assistant Examiner*—Sin J. Lee
(74) *Attorney, Agent, or Firm*—Burns, Doane, Swecker & Mathis, LLP

(57) ABSTRACT

Disclosed is a positive or negative lithographic printing plate precursor which can form an image at high sensitivity by heating or heat developed by light-heat conversion, requires no development processing after image writing, has good sensitivity and excellent printing durability, is significantly improved in scumming resistance, and can directly make a plate by operating an infrared laser based on a digital signal, the precursor comprising a polymer compound having a functional group changeable in hydrophilicity by heat, acid or radiation and an under layer with which the polymer compound combined, wherein the polymer compound is a straight-chain polymer compound directly combined at an end of a polymer chain thereof with a surface of the under layer by chemical bonding, or comprises (i) a polymer backbone chemically combined with a surface of the under layer and (ii) a straight-chain polymer compound combined at an and of a polymer chain thereof with the polymer backbone and having a functional group changeable in hydrophilicity.

8 Claims, No Drawings

LITHOGRAPHIC PRINTING PLATE PRECURSOR

FIELD OF THE INVENTION

The present invention relates to a lithographic printing plate precursor, and particularly to a lithographic printing plate precursor requiring no development processing, excellent in sensitivity and scumming resistance, and able to take both the positive and negative forms. More particularly, the invention relates to a lithographic printing plate precursor which can directly make a plate by operating an infrared laser based on a digital signal.

BACKGROUND OF THE INVENTION

Previously, methods for directly making printing plates from digitized image data with no interposition of lithographic films have variously been proposed. However, these methods are complicated in post-processing treatment processes after exposure, or necessitate the waste liquid treatment of post-processing treatment solutions. They are therefore not necessarily satisfactory.

On the other hand, in the recent platemaking and printing industry, the rationalization of platemaking work has been promoted. Accordingly, printing plate precursors not requiring such complicated development processing as described above and usable for printing as such after exposure have been desired.

As printing plate precursors coping with the above-mentioned demand, JP-A-11-84658 (the term "JP-A" as used herein means an "unexamined published Japanese patent applications") discloses positive lithographic printing plate precursors in which polymers having groups changing from hydrophobic to hydrophilic by heat, such as sulfonate groups and alkoxyalkyl ester groups, are cross-linked, and JP-A-7-1849 discloses negative lithographic printing plate precursors in which microcapsules containing hydrophobic compositions reactable with hydrophilic groups are dispersed in cross-linked hydrophilic layers.

In these lithographic printing plate precursors, image recording layers have cross-linked structures, so that image areas and non-image areas are formed by the surface polar conversion, not by the removal of corresponding areas of the image recording layers. Accordingly, these precursors are of the non-processing type requiring no development processing.

However, even in the above-mentioned lithographic printing plate precursors, the sensitivity desired is not fully compatible with the scumming resistance of the resulting printing plates.

SUMMARY OF INVENTION

An object of the invention is to overcome the prior-art disadvantages described above to provide a positive or negative lithographic printing plate precursor which can form an image at high sensitivity by heating or heat developed by light-heat conversion, requires no development processing after image writing, has good sensitivity and excellent printing durability, is significantly improved in scuffing resistance, and can directly make a plate by operating an infrared laser based on a digital signal.

As a result of intensive investigation, the present inventors have discovered that the above-mentioned object is attained by the following means, thus completing the invention.

That is to say, the invention is as follows:

(1) A lithographic printing plate precursor comprising a polymer compound having a functional group changeable in hydrophilicity by heat, acid or radiation and an under layer with which the polymer compound is combined, wherein the polymer compound is directly combined with a surface of the under layer by chemical bonding;

(2) A lithographic printing plate precursor comprising a polymer compound having a functional group changeable in hydrophilicity by heat, acid or radiation and an under layer with which the polymer compound is combined, wherein the polymer compound is a straight-chain polymer compound directly combined at an end of a polymer chain thereof with a surface of the under layer by chemical bonding, or the polymer compound comprises (i) a polymer backbone chemically combined with a surface of the under layer and (ii) a straight-chain polymer compound combined at an end of a polymer chain thereof with the polymer backbone and having a functional group changeable in hydrophilicity;

(3) A lithographic printing plate precursor comprising a support having provided thereon a photosensitive layer containing at least a photo acid generator and a polymer compound having a functional group changeable in hydrophilicity by acid, the polymer compound being directly chemically combined with a surface of the support;

(4) The lithographic printing plate precursor described in (3), wherein the polymer compound is a straight-chain polymer compound directly chemically combined at an end of a polymer chain thereof with the surface of the support, or the polymer compound comprises (i) a polymer backbone chemically combined with the surface of the support and (ii) a straight-chain polymer compound combined at an end of a polymer chain thereof with the polymer backbone and having a functional group changeable in hydrophilicity; and (5) The lithographic printing plate precursor described in (3) or (4), wherein the polymer compound is a polymer compound comprising a side chain having a functional group changeable from hydrophobic to hydrophilic by acid.

In the lithographic printing plate precursors of the surface polar conversion type described in JP-A-11-84658 and JP-A-7-1849, also the water retention of the image recording layers is considered to be necessary for expressing the hydrophilicity with no scumming in printing. For that purpose, it has been considered that the polar conversion is required to take place not only on surfaces of the image recording layers, but also in the inside of the layers. In the above-mentioned precursors, therefore, larger energy is required for allowing the polar conversion to take place in the inside of the image recording layers, and the ordinary amount of image recording energy sometimes results in low sensitivity. Fox enhancing the sensitivity at the ordinary amount of image recording energy, it is conceivable that the image recording layers are decreased in thickness. However, in the above-mentioned conventional lithographic printing plate precursors, the thinned layers cause deterioration of the water retention, resulting in deterioration of the scumming resistance. It has been therefore impossible to express sufficient discrimination between the hydrophilicity and the lipophilicity. Further, the thinned layers have raised the problem that the printing durability is deteriorated.

In contrast, according to the lithographic printing plate precursors of the invention, the polymer compound having the functional group changeable in hydrophilicity by heat, acid or radiation (hereinafter also briefly referred to as the "polar conversion group") is combined with the surface thereof, for example, at an end of the compound directly or through the polymer backbone. Accordingly, water is retained among a plurality of chains of the polar conversion group-containing polymer in non-image areas. As a result, it is conceivable that even the thinned layer can express the hydrophilicity with no scumming in printing. As described above, the lithographic printing plate precursor of the invention can efficiently express the hydrophilicity, so that an image recording layer thereof can be decreased in thickness, and also increased in sensitivity. Further, in the lithographic printing plate precursor of the invention, the polymer compound is directly combined with the under layer by chemical bonding. Accordingly, the precursor has the advantage that it is excellent in printing durability even when the image recording layer is thin.

Furthermore, in the lithographic printing plate precursor of the invention, it is preferred that a surface of the under layer with which the polymer compound is directly combined is roughened. By giving irregularities to the under layer surface (solid surface) as described later, the lithographic printing plate precursor of the invention has the features that the hydrophilicity of non-image areas is high, that the degree of discrimination between the hydrophilicity and the lipophilicity is increased, and that the scumming resistance in printing is excellent.

DETAILED DESCRIPTION OF THE INVENTION

The lithographic printing plate precursors of the invention will be described in detail below.

Description of Surface Graft Polymerization

Means for preparing the image recording layer characterizing the lithographic printing plate precursor of the invention, in which a polymer chain having a functional group changeable in hydrophilicity is chemically combined at an end thereof directly or through a polymer backbone, will be described below.

The image recording layer characterizing the lithographic printing plate precursor of the invention is generally prepared by means called "surface graft polymerization", The term "graft polymerization" means a process for synthesizing a graft polymer by giving an active species onto a chain of a polymer compound, and initiating polymerization of another monomer thereby. In particular, when the polymer compound to which the active species is given forms a solid surface, the process is called "surface graft polymerizations".

As the surface graft polymerization realizing the invention, any of known methods described in literatures can be used. For example photochemical graft polymerization and plasma graft polymerization are described as the surface graft polymerization in *Shin Kobunshi Jikkengaku* 10, edited by Kobunshi Gakkai, published by Kyoritsu Shuppan Co., 1994, page 135. Further, graft polymerization using radiations such as γ-rays and electron beams is described in *Kyuchaku Gijutsu Binran*, supervised by Takeuchi, NTS Co., February 1999, pages 203 and 695.

As specific methods of the photochemical graft polymerization, methods described in JP-A-10-296895 and JP-A-11-119413 can be used.

The surface graft layer in which the polymer chain is directly chemically combined at an end thereof can also be prepared by giving a reactive functional group such as a trialkoxysilyl group, an isocyanate group, an amino group, a hydroxyl group or a carboxyl group to the end of the polymer chain, and conducting the coupling reaction thereof with a functional group of a surface of the under layer of the lithographic printing plate precursor.

The under layer of the lithographic printing plate precursor indicates a layer with a surface of which the polar conversion group-containing polymer compound is chemically combined at an end thereof directly or through a polymer backbone. It may be either a support itself of the lithographic printing plate precursor of the invention or a layer separately provided on the support.

Further, the surface layer in which the chain of the polar conversion group-containing polymer compound is chemically combined at an end thereof through the polymer backbone can also be prepared by giving a functional group which can conduct the coupling reaction with a functional group of a surface of the under layer to a side chain of the polymer backbone to synthesize a graft polymer compound in which a polymer chain having a functional group changeable in hydrophilicity is incorporated as a graft chain, and conducting the coupling reaction of the polymer with the functional group of the surface of the under layer.

Description of Functional Group Changeable in Hydrophilicity

Then, the functional group (polar conversion group) changeable in hydrophilicity by heat, acid or radiation, which is one of the characteristics of the lithographic printing plate precursor of the invention, will be described.

The polar conversion groups include two kinds of functional groups. One is a functional group changeable from hydrophobic to hydrophilic, and the other is a functional group changeable from hydrophilic to hydrophobic.

(Functional Group Changeable from Hydrophobic to Hydrophilic)

The functional groups changeable from hydrophobic to hydrophilic include known functional groups described in literatures.

Useful examples of these functional groups include but are not limited to alkyl sulfonates, disulfones and sulfonimides described in JP-A-10-282672, alkoxyalkyl esters described in EP-A-0652483 and WO92/9934, t-butyl esters described in H. Ito, et al., *Macromolecules*, 21, 1477, and carboxylates protected with acid-decomposable groups described in literatures such as silyl esters and vinyl esters. Of these, particularly preferred are secondary alkyl sulfonates shown below, tertiary carboxylates and alkoxyalkyl esters shown below.

In the invention, the secondary alkyl sulfonates particularly preferred as the functional groups changeable from hydrophobic to hydrophilic are ones represented by the following general formula (1):

(1)

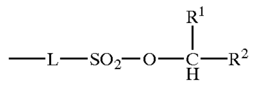

wherein L represents an organic group comprising at least one multivalent non-metallic atom necessary for connection to a polymer skeleton, $R^1$ and $R^2$ each represents a substituted or unsubstituted alkyl group, or a substituted or unsubstituted aryl group, and $R^1$ and $R^2$ may for a ring together with the secondary carbon atom (CH) to which they are attached.

$R^1$ and $R^2$ of general formula (1) each represents a substituted or unsubstituted alkyl group or a substituted or unsubstituted aryl group, and $R^1$ and $R^2$ may form a ring together with the secondary carbon atom (CH) to which they are attached. When $R^1$ and $R^2$ each represents a substituted or unsubstituted alkyl group, the alkyl groups include straight-chain, branched or cyclic alkyl groups such as methyl, ethyl, isopropyl, t-butyl and cyclohexyl, and ones each having from 1 to 25 carbon atoms are suitably used. When $R^1$ and $R^2$ each represents a substituted or unsubstituted aryl group, the aryl groups include carbocyclic aryl groups and heterocyclic aryl groups. The carbocyclic aryl groups include ones each having from 6 to 19 carbon atoms such as phenyl, naphthyl, anthracenyl and pyrenyl. The heterocyclic aryl groups include ones each having from 3 to 20 carbon atoms and from 1 to 5 heteroatoms such as pyridyl, furyl and quinolyl, benzofuryl, thioxanthone and carbazole in which benzene rings are cyclocondensated.

When $R^1$ and $R^2$ are substituted alkyl groups or substituted aryl groups, the substituents include alkoxy groups each having from 1 to 20 carbon atoms such as methoxy and ethoxy; halogen atoms such as fluorine, chlorine and bromine; halogen-substituted alkyl groups such as trifluoromethyl and trichloromethyl; alkoxycarbonyl or aryloxycarbonyl groups each having form 2 to 15 carbon atoms such as methoxycarbonyl, ethoxycarbonyl, t-butyloxycarbonyl and p-chlorophenyloxycarbonyl; a hydroxyl group; acyloxy groups such as acetyloxy, benzoyloxy and p-diphenylaminobonzoyloxy; carbonate groups such as t-butyloxycarbonyloxy; ether groups such as t-butyloxycarbonylmethyloxy and 2-pyranyloxy; substituted and unsubstituted amino groups such as amino, dimethylamino, diphenylamino, morpholino and acetylamino; thioether groups such as methylthio and phenylthio; alkenyl groups such as vinyl and steryl; a nitro group; a cyano group; acyl groups such as formyl, acetyl and benzoyl; aryl groups such as phenyl and naphthyl; and heteroaryl groups such as pyridyl. When $R^1$ and $R^2$ are substituted aryl groups, the substituents which can be used include alkyl groups such as methyl and ethyl, in addition to the above-mentioned groups.

$R^1$ and $R^2$ are preferably substituted or unsubstituted alkyl groups in terms of excellent storage stability, and particularly preferably alkyl groups substituted by electron attractive groups such as alkoxy, carbonyl, alkoxycarbonyl, cyano and halogen, or alkyl groups such as cyclohexyl and norbornyl in terms of aging stability. Compounds in which the chemical shift of secondary methine hydrogen in bichloroform on proton NMR appears in a magnetic field lower than 4.4 ppm are preferred, and compounds in which it appears in a magnetic field lower than 4.6 ppm are more preferred. The reason why the alkyl groups substituted by electron attractive groups are particularly preferred is considered to be that carbocations possibly produced as intermediates in pyrolysis are unstabilized by the electron attractive groups to inhibit the pyrolysis. Specifically, as the structures of $-CHR^1R^2$, structures represented by the following formulas are particularly preferred.

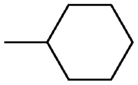

-continued

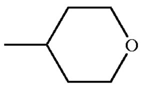

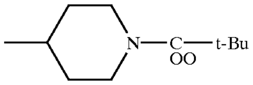

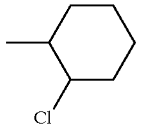

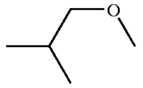

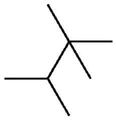

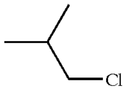

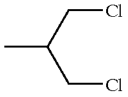

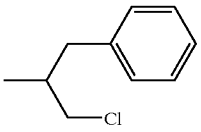

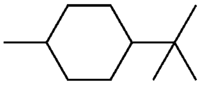

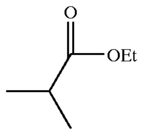

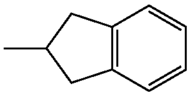

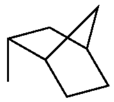

The multivalent connecting group represented by L of general formula (1), which comprises at least one nonmetallic atom, is composed of 1 to 60 carbon atoms, 0 to 10 nitrogen atoms, 0 to 50 oxygen atoms, 1 to 100 hydrogen atoms and 0 to 20 sulfur atoms, More specific exiles of the connecting groups include combinations of the following structural units:

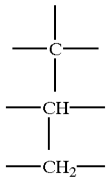

-continued

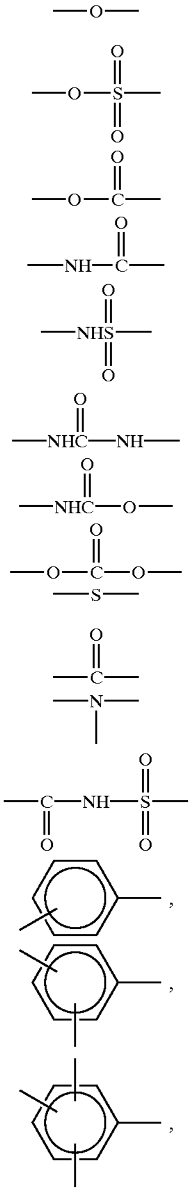

Multivalent Naphthalene, Multivalent Anthracene

When the multivalent connecting groups have substituents, the substituents which can be used include alkyl groups having from 1 to 20 carbon atoms such as methyl and ethyl; aryl groups having from 6 to 16 carbon atoms such as phenyl and naphthyl; a hydroxyl group; a carboxyl group; a sulfonamido group; an N-sulfonylamido group; acyloxy groups having from 1 to 6 carbon atoms such as acetoxy; alkoxy groups having from 1 to 6 carbon atoms such as methoxy and ethoxy; halogen atoms such as chlorine and bromine; alkoxycarbonyl groups having from 2 to 7 carbon atoms such as methoxycarbonyl, ethoxycarbonyl and cyclohexyloxycarbonyl; a cyano group; and carbonate groups such as t-butyl carbonate.

In the invention, the alkoxyalkyl ester groups particularly excellent as the functional groups changeable from hydrophobic to hydrophilic are ones represented by the following general formula (2):

(2)

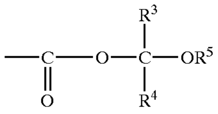

wherein $R^3$ represents a hydrogen atom, $R^4$ represents a hydrogen atom or an alkyl group having 18 or less carbon atoms, $R^5$ represents an alkyl group having 18 or less carbon atoms, and two of $R^3$, $R^4$ and $R^5$ may be combined with each other to form a ring. In particular, it is preferred that $R^4$ and $R^5$ are combined with each other to form a 5- or 6-membered ring.

In the invention, as the functional groups changeable from hydrophobic to hydrophilic, the secondary alkyl sulfonate groups represented by general formula (1) are particularly preferred.

Specific examples of the functional groups represented by the above-mentioned general formulas (1) and (2) are shown below:

(1)

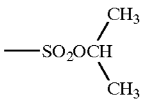

(2)

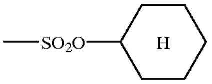

(3)

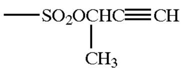

(4)

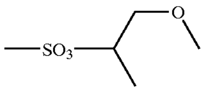

(5)

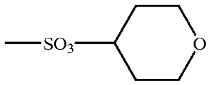

(6)

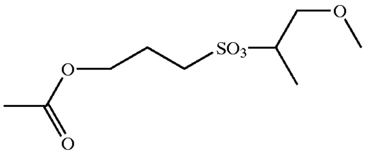

(7)

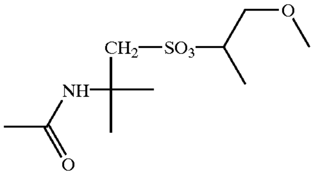

(8)

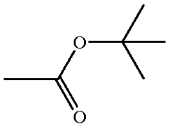

-continued (9)

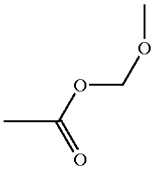

(10)

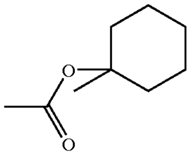

(11)

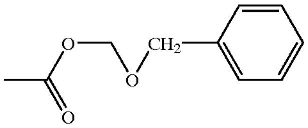

(12)

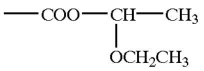

(13)

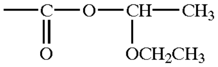

(14)

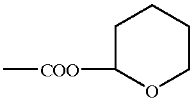

(Functional Group Changeable from Hydrophilic to Hydrophobic)

In the invention, the functional groups changeable from hydrophilic to hydrophobic by heat, acid and radiation include known functional groups. Although there is no particular limitation on the functional groups, suitable examples thereof include carboxylic acid groups and carboxylate groups represented by the following general formula (3):

(3)

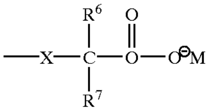

wherein X represents —O—, —S—, —Se—, —$NR^6$—, —CO—, —SO—, —$SO_2$—, —PO—, —$SiR^8R^9$— or —CS—, $R^6$, $R^7$, $R^8$ and $R^9$ each independently represents a monovalent group, M represents an ion having a positive charge.

Specific examples of $R^6$, $R^7$, $R^8$ and $R^9$ include —F, —Cl, —Br, —I, —CN, —$R^{10}$, —$OR^{10}$, —$OCOR^{10}$, —$OCOOR^{10}$, —$OCONR^{10}R^{11}$, —$OSO_2R^{10}$, —$COR^{10}$, —$COOR^{10}$, —$CONR^{10}R^{11}$, —$NR^{10}R^{11}$, —$NR^{10}$—$COR^{11}$, —$NR^{10}$—$COOR^{11}$, —$NR^{10}$—$CONR^{11}R^{12}$, —$SR^{10}$, —$SOR^{10}$, —$SO_2R^{10}$ and —$SO_3R^{10}$.

$R^{10}$, $R^{11}$ and $R^{12}$ each represents a hydrogen atom, an alkyl group, an aryl group, an alkenyl group or an alkynyl group.

Of these, preferred as $R^6$, $R^7$, $R^8$ and $R^9$ are hydrogen atoms, alkyl groups, aryl groups, alkynyl groups and alkenyl groups.

Specific examples of M include the ion having a positive charge as described above.

Specific examples of the functional groups represented by general formula (3) are shown below:

(15)

$—SO_2CH_2CO_2H$ (16)

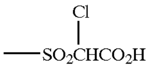

(17)

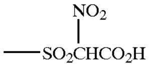

(18)

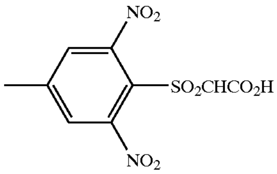

(19)

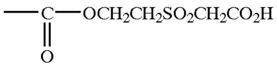

(20)

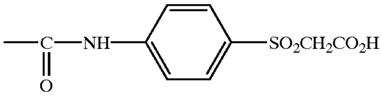

(21)

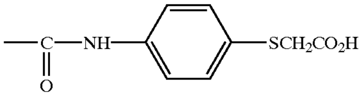

(22)

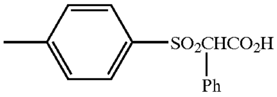

(23)

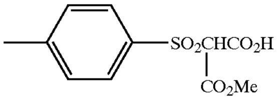

(24)

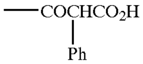

(25)

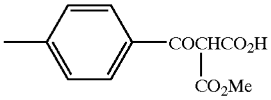

(26)

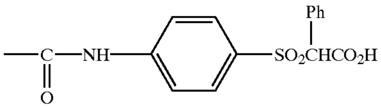

(27)

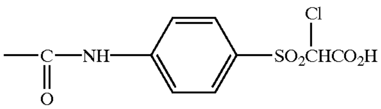

(28)

$—SO_2CH_2CO_2^-Na^+$ (29)

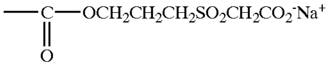

(30)

$—SO_2CH_2CO_2^-NMe_4^+$

-continued (31)

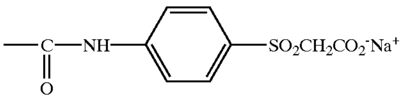

(32)

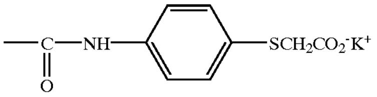

In the invention, the polar conversion group-containing polymer compounds may be either homopolymers of one kind of monomer or copolymers of two or more kinds of monomers, having the functional groups as described above. Further, they may be copolymers with other monomers as long as the effects of the invention are not impaired.

Specific examples of the monomers having the functional groups as described above, (Specific Examples of the Monomers Having the Functional Groups Represented by General Formulas (1) and (2))

M-1

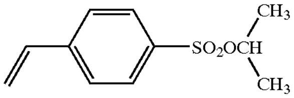

M-2

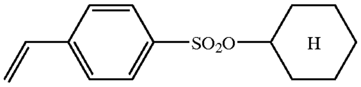

M-3

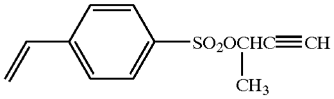

M-4

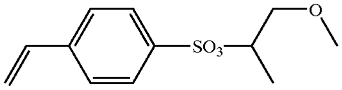

M-5

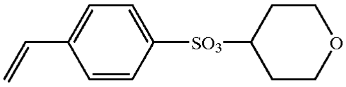

M-6

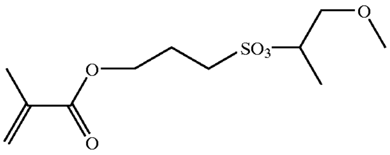

M-7

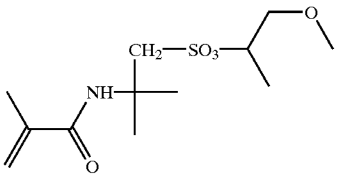

-continued

M-8

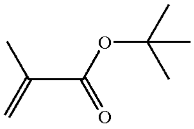

M-9

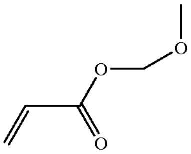

M-10

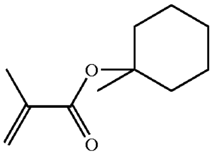

M-11

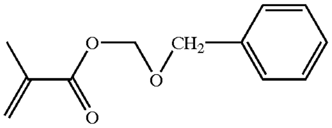

M-12

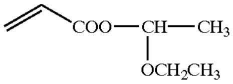

M-13

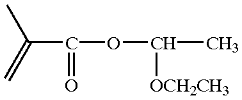

M-14

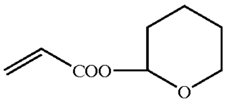

M-15

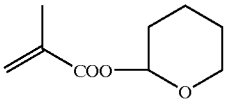

(Specific Examples of the Monomers Having the Functional Groups Represented by General Formula (3))

M-16

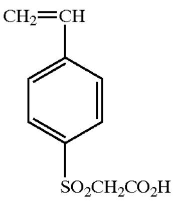

M-17

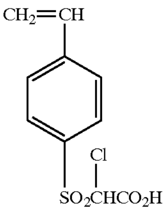

-continued

M-18

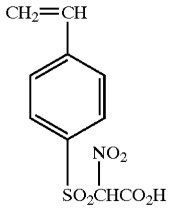

M-19

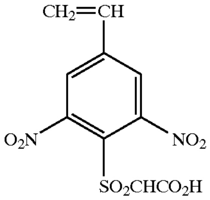

M-20

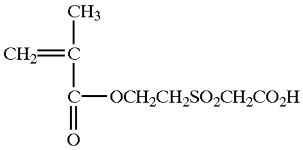

M-21

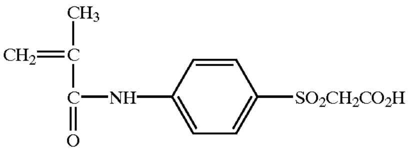

M-22

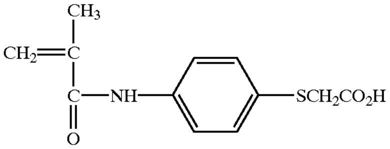

M-23

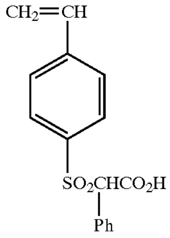

M-24

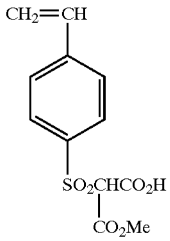

M-25

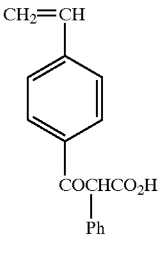

-continued

M-26

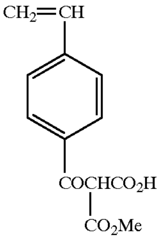

M-27

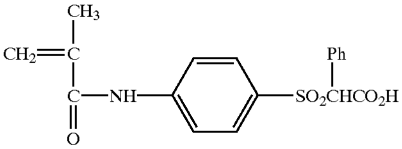

M-28

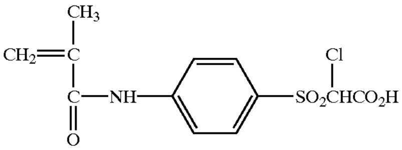

M-29

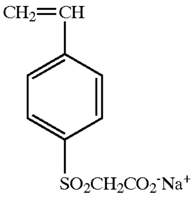

M-30

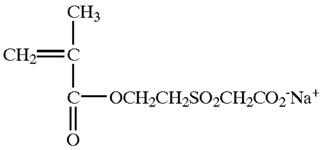

M-31

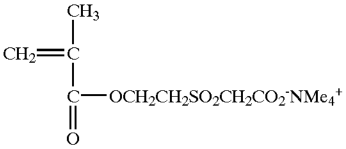

M-32

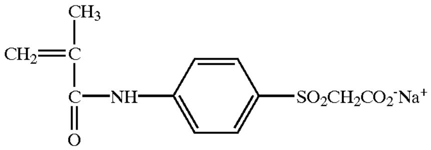

M-33

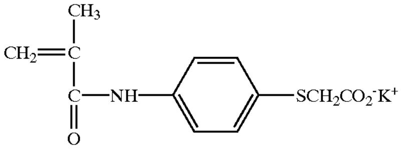

Description of Functional Group Changeable in Hydrophilicity by Acid

The functional groups changeable in hydrophilicity by acid include functional groups changeable from hydrophobic to hydrophilic, and functional groups changeable from hydrophilic to hydrophobic. In the invention, it is advantageous to use the functional groups synthetically changeable from hydrophobic to hydrophilic.

The functional groups changeable from hydrophobic to hydrophilic include known functional groups described in literatures. Specific examples thereof include hydroxyl groups, phenolic hydroxyl groups, amino groups and carboxyl groups protected with acid-decomposable groups described in T. W. Greene, *Protective Group in Organic Synthesis*, A Wiley-Interscience Publication (1981). Particularly useful examples of these functional groups include but are not limited to alkoxyalkyl esters described in EP-A-0652483 and WO92/9934, t-butyl esters described in H. Ito, et al., *Macromolecules*, 21, 1477, and carboxylates protected with acid-decomposable groups described in literatures such as silyl esters and vinyl esters. Of these, particularly preferred are tertiary carboxylates and alkoxyalkyl esters shown below.

In the invention, the alkoxyalkyl esters particularly preferred as the functional groups changeable from hydrophobic to hydrophilic are ones represented by the foregoing general formula (2).

(Photo Acid Generator)

The photo acid generator contained in a photosensitive layer in the lithographic printing plate precursor of the invention is a compound generating an acid by light. In general, the photo acid generators include photoinitiators for cationic photopolymerization, photoinitiators for radical photopolymerization, photodecoloring agents or photodiscoloring agents for dyes, known compounds used in microresists, which generate acids by light, and mixtures thereof. They can be appropriately selectively used.

Examples of such photo acid generators include diazonium salts described in S. I. Schlesinger, *Photogr. Sci. Eng.*, 18, 387 (1974) and T. S. Bal et al., *Polymer*, 21, 423 (1980), ammonium salts described in U.S. Pat. Nos. 4,069,055 and 4,069,056, and JP-A-3-140140, phosphonium salts described in D. C. Necker et al., *Macromolecules*, 17, 2468 (1984), C. S. Wen et al., *Teh. Proc. Conf. Rad. Curing ASIA*, p. 478, Tokyo, October (1988), U.S. Pat. Nos. 4,069,055 and 4,069,056, iodonium salts described in J. V. Crivello et al., *Macromocules*, 10 (6), 1307 (1977), *Chem. & Eng, News*, Nov. 28, 31 (1988), European Patents 104,143, JP-A-2-150848 and JP-A-2-296514, sulfonium salts described in J. V. Crivello et al., *Polymer J.*, 12, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci., Polymer Chem. Ed.*, 17, 2877 (1979), European Patent 370,693, U.S. Pat. No. 3,902,114, European Patents 233,567, 297,443 and 297,442, U.S. Pat. Nos. 4,933,377, 4,760,013, 4,734,444 and 2,833,827, and German Patents 2,904,626, 3,604,580 and 3,604,581, selenonium salts described in J. V. Crivello et al., *Macromolecules*, 10 (6), 1307 (1977) and J. V. Crivello et al., *J. Polymer Sci., Polymer Chem. Ed.*, 17, 1047 (1979), onium salts such as arsonium salts described in C. S. Wen et al., *Teh. Proc. Conf. Rad. Curing ASIA*, p. 478, Tokyo, October (1988), organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339, organic metals/organic halides described in K. Meier et al., *J. Rad. Curing*, 13 (4), 26 (1986), T. P. Gill et al., *Inorg. Chem.*, 12, 3007 (1980), D. Astruc, *Acc. Chem. Res.*, 12 (12), 377 (1986) and JP-A-2-161445, photo acid generators having o-nitrobenzyl type protective groups described in S. Hayase et al., *J. Polymer Sci.*, 25, 753 (1987), E. Reichman et al., *J. Polymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24), 2205 (1973), D. H. R. Barton et al. *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), (1985), H. M. Houlihan et al., *Macromolecules*, 21, 2001 (1988), P. M. Collins et al., *J. Chem. Soc. Chem. Commun.*, 532 (1972), S. Hayase et al., *Macromolecules*, 18, 1799 (1985), E. Reichmanis et al., *J. Eletrochem. Soc., Solid State Sci. Technol.*, 130 (6), F. M. Houlihan at al., *Macromolecules*, 21, 2001 (1988), European Patents 0,290,750, 046,083, 156,535, 271, 851 and 0,388,343, U.S. Pat. Nos. 3,901,710 and 4,181,531, JP-A-60-198538 and JP-A-53-133022, compounds producing sulfonic acids by photolysis which are represented by iminosulfonates described in M. Tunooka et al., *Polymer Preprints Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints Japan*, 37 (3), European Patents 0,199,672, 84,515, 044,115 and 0,101, 122, U.S. Pat. Nos. 4,618,564, 4,371,605 and 4,431,774, JP-A-64-18143, JP-A-2-245756 and JP-A-3-140109, and disulfone compounds described in JP-A-61-166544.

Further, compounds in which the acid generators are introduced into their main chains or side chains can be used. Examples of such compounds are described in M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9, 625 (1988), Y. Yamada et al. *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-14603, JP-A-63-163452, JP-A-62-153853 and JP-A-63-146029.

Further, compounds generating acids with light can also be used which are described in V. N. R. Pillai *Synthesis*, (1) 1 (1980), A. Abad et al., *Tetrahedron Lett.*, (47), 4555 (1971), D. H. R. Barton et al., *J. Chem. Soc.*, (C), 329 (1970), U.S. Pat. No. 3,779,778 and European Patent 126, 712.

In the invention, the amount of the acid generating agent added is usually from about 0.001% to about 40% by weight, preferably from 0.01% to 20% by weight, and more preferably from 0.1% to 5% by weight, based on the total solid content of photosensitive layer.

Description of Constitution of Lithographic Printing Plate Precursor

The photographic printing plate precursor of the invention comprises (i) the surface graft layer in which the polymer compound having the polar conversion group described above is chemically combined at an end thereof directly or through a polymer backbone and (ii) the under layer with which the polymer compound can be chemically combined at the end thereof directly or through the polymer backbone. Further, as the chemical bond, covalent bond is preferred for the invention.

Description of Under Layer

The under layer may be either an inorganic layer or an organic layer, as long as it is suitable for providing the surface graft layer by graft synthesis. In the photographic printing plate precursor of the invention, changes in hydrophilicity are expressed by a thin polymer layer, so that the polarity of the under layer is not significant. It may be either hydrophilic or hydrophobic. Of the inorganic and organic layers, a layer having an organic layer is preferred, and an organic polymer layer is particularly preferred, when the thin polymer layer of the invention is synthesized by photochemical graft polymerization, plasma graft polymerization and radiation graft polymerization. As the organic polymers, any of synthetic resins such as epoxy resins, acrylic resins, urethane resins, phenol resins, styrene resins, vinyl resins, polyester resins, polyamide resins, melamine resins and formalin resins, and natural resins such as gelatin, casein, cellulose and starch can be used. However, in photochemical graft polymerization, plasma graft polymerization and radiation graft polymerization, graft polymerization is initiated by the abstraction of hydrogen from the organic polymers. Accordingly, the use of polymers from which hydrogen is easily abstracted, particularly acrylic resins, urethane resins, styrene resins, vinyl resins, polyester resins, polyamide resins and epoxy resins, is preferred particularly in respect to production suitability.

The under layer may also serve as a substrate (support) described later, and a substrate may be provided under the under layer as needed.

Then, another characteristic of the lithographic printing plate precursor of the invention is that a surface of the under layer with which the above-mentioned polymer compound is directly chemically combined is preferably roughened. The irregularities of the solid surface used in the invention will be described.

Definitions of Surface Irregularities

The center line average height Ra of the two-dimensional roughness parameters is from 0.1 μm to 1 μm, the maximum height Ry is from 1 μm to 10 μm, the ten point average height Rz is from 1 μm to 10 μm, the average space of irregularities Sm is from 5 μm to 80 μm, the average space between local crests S is from 5 μm to 80 μm, the maximum height Rt is from 1 μm to 10 μm, the center line crest height Rp is from 1 μm to 10 μm, and the center line root depth Rv is from 1 μm to 10 μm.

The two-dimensional roughness parameters are based on the following definitions, Center line average height Ra: A value obtained by sampling a portion of a measured length L in a center line direction from a roughness curve, and arithmetically averaging absolute values of the deviation of the center line of the sampled portion and the roughness curve.

Maximum height Ry: A value obtained by sampling a reference length from a roughness curve in a centerline direction thereof, and measuring a space between a crest line and a root line of the sampled portion in the direction of longitudinal magnification of the roughness curve.

Ten point average height Rz: A value obtained by sampling a reference length from a roughness curve in a center line direction thereof, and representing by micrometer (μm) the sum of an average value of absolute values of altitudes Yp of crests from the highest to the fifth and an average value of absolute values of altitudes Yv of toots from the lowest to the fifth, measured in the direction of longitudinal magnification from a center line of the sampled portion.

Average space of irregularities Sm: A value obtained by sampling a reference length from a roughness curve in a center line direction thereof, determining the Sum of average line lengths corresponding to one crest and one root adjacent thereto in the sampled portion, and representing an arithmetic average value of spaces between many irregularities by millimeter (mm).

Average space between local crests S: A value obtained by sampling a reference length from a roughness curve in a center line direction thereof, determining an average line length corresponding to a space between local crests adjacent to each other in the sampled portion, and representing an arithmetic average value of spaces between the many local crests by millimeter (mm).

Maximum height Rt: A space value between two straight lines, when a portion sampled from a roughness curve by a reference length is put between the two straight lines parallel to a center line of the sampled portion.

Center line crest height Rp: A space value between a center line of a portion sampled from a roughness curve by a measured length L in the direction of the center line thereof and a straight line parallel thereto and passing the highest crest.

Center line root depth Rv: A space value between a center line of a portion sampled from a roughness curve by a measured length L in the direction of the center line thereof and a straight line parallel thereto and passing the lowest root.

Preparation Method of Irregular Surface (Kind of Preparation Method)

For forming a roughened surface on the solid surface, various means can be employed. For example, the solid surface is mechanically rubbed by sand blasting or brushing to shave the surface, thereby forming concaves. Thus, the roughened surface can be formed. Further, irregularities can also be formed by mechanical embossing. Furthermore, convexes may be formed on the surface by gravure printing to form a roughened surface. A layer containing fine solid particles (matte agent) may be formed on the solid surface by means such as coating or printing to form a roughened surface. The fine solid particles can also be contained in (internally added to) a polymer film in the stage of preparing the polymer film to form irregularities on a surface of the polymer film. Further, the roughened surface can also be formed by solvent treatment, corona discharge treatment, plasma treatment, electron beam irradiation treatment or X-ray irradiation treatment. The above-mentioned means may be employed in combination. The means for forming irregularities by sandblasting or resin printing, or the means for forming irregularities by adding fine solid particles can be particularly preferably used.

(Fine Solid Particle Method)

As the above-mentioned fine solid particles, various materials such as fine metal particles, fine metal oxide particles and fine particles of organic or inorganic polymer or low-molecular weight compounds can be utilized. Specific examples of the fine particles include copper powder, tin powder, iron powder, zinc oxide powder, silicon oxide powder, titanium oxide powder, aluminum oxide powder, molybdenum disulfide powder, calcium carbonate powder, clay, mica, corn starch, boron nitride, silicone resin particles, polystyrene resin particles, fluorine resin particles, acrylic resin particles, polyester resin particles, acrylonitrile copolymer resin particles, zinc stearate and calcium behenate. The average particle size of the fine particles is preferably 0.05 μm or more, and more preferably 0.1 μm or more. When the fine particles are adhered to a surface of the sheet or the surface of the sheet is provided with a layer containing the fine particles, the average particle size of the fine particles approximately corresponds to the size of irregularities on the roughened surface. When the fine particles are internally added to the sheet, the size of irregularities on the roughened surface depends on the average particle size of the fine particles and the thickness of the sheet. Accordingly, in the latter case, it is necessary for obtaining the optimum size of irregularities to experimentally determine the optimum particle size by combinations of sheets and fine particles.

Specific examples of methods for forming irregularities by fixing the fine solid particles to the surface of the support include methods of adding the fine solid particles before film formation to form a film, methods of applying a dispersion of the fine solid particles in a binder, followed by drying, methods of embedding the fine particles in a film by mechanical pressure after film formation, and methods of electrodepositing the fine solid particles after film formation.

Specific examples of the methods of adding the fine solid particles before film formation to form a film include the following method. A PET masterbatch containing a pigment as the fine solid particles is melt extruded onto a cooling drum to form a film, which is then oriented longitudinally and laterally in this order, and finally heat treated to provide an irregular PET film. As the pigment, one in which one or more of titanium oxide, alumina and silica are compounded can be used. The center line average surface roughness of the film can be adjusted by the particle size and amount of the pigment to be compounded. For example, it can be adjusted by compounding the pigment having a particle size of about 1 $\mu$m to about 10 $\mu$m in an amount of about 0.5% to 5% by weight. A larger particle size and amount of the pigment compounded results in a higher center line average surface roughness. For obtaining the aimed roughened surface having irregularities, it is necessary to determine the particle size of the pigment and adjust the amount thereof compounded.

(Sand Blasting Process)

Sand blasting is a process for roughening a surface of a polymer film by spraying a fine-grained abrasive on the surface of the film at high speed. Sand blasting treatment may be carried out by known methods. For example, carborundum (silicon carbide powder) or metal particles can be strongly sprayed together with compressed air, followed by washing with water and drying to attain the object. The control of the center line average surface roughness of the film by the sand blasting treatment can be carried out by adjusting the particle size and treating amount (treating frequency per area) of the particles to be sprayed. A larger particle size and treating amount of the particles results in a higher center line average surface roughness of the film surface.

More particularly, the sand blasting treatment is surface treatment conducted by spraying the abrasive on the film surface with compressed air, and the irregularities formed thereby are adjusted by the conditions of the sand blasting treatment.

The abrasive is blown off through a sand blasting blow-off nozzle to spray it on the film. As to the treating conditions, it is necessary to adjust the blow-off amount (blast amount) of the abrasive, and the angle and spacing between the sand blasting blow-off nozzle and the film (blast angle and blast distance). The abrasive in a hopper is blown off through the sand blasting blow-off nozzle by compressed air sent out of an air chamber to spray it on the film surface, thereby conducting the sand blasting treatment under conditions made proper. Specifically, these methods are described, for example, as known methods in JP-A-8-34866, JP-A-11-90827 and JP-A-11-254590.

Such treating conditions in the sand blasting treatment are required to be such conditions that the abrasive and shavings are not left on the film surface, and that the strength of the film is not reduced. Such treating conditions can be experientially appropriately established.

Specifically, silica sand and other abrasives are used as the abrasives. In particular, the use of silica sand having a particle size of 0.05 mm to 10 mm, further 0.1 mm to 1 mm is preferred. The blast distance is preferably from 100 mm to 300 mm, and the blast angle is preferably from 45 degrees to 90 degrees, and more preferably from 45 degrees to 60 degrees. Further, the blast amount is preferably from 1 kg/minute to 10 kg/minute. These are for preventing the abrasive and shavings from being left on the film surface, and further for controlling the grinding depth. The grinding depth is preferably limited to 0.01 $\mu$m to 0.1 $\mu$m, thereby being able to prevent the film from being reduced in strength.

(Light-Heat Conversion Material)

When image recording is conducted on the lithographic printing plate precursor of the invention with an IR laser, it is preferred that a light-heat conversion material for converting the light energy to heat energy is contained somewhere in the lithographic printing plate precursor. The portion where the light-heat conversion material is contained may be any of, for example, the polymer layers, the under layer and the substrate. The light-heat conversion material may also be added to an intermediate layer placed between the under layer and the substrate.

In the lithographic printing plate precursors of the invention, as the light-heat conversion materials which may be contained, all materials can be used, as long as they can absorb light rays such as ultraviolet rays, visible light rays, infrared rays and white light rays to convert them to heat. Examples thereof include carbon black, carbon graphite, pigments, phthalocyanine pigments, iron powder, graphite powder, iron oxide powder, lead oxide, silver oxide, chromium oxide, iron sulfide and chromium sulfide. Particularly preferred are dyes, pigments or metals effectively absorbing infrared rays having a wavelength of 760 nm to 1,200 nm.

As the dyes, commercial dyes and known dyes described in literatures (for example, *Senrvo Binran*, edited by Yuki Gosei Kagaku Kyokai, 1970) can be utilized. Specific examples thereof include azo dyes, metal complex salt dyes, pyrazolone azo dyes, anthraquinone dyes, phthalocyanine dyes, carbonium dyes, quinoneimine dyes, methine dyes, cyanine dyes and metal thiolate complexes. Preferred examples of the dyes include cyanine dyes described in JP-A-58-125246, JP-A-59-84356, JP-A-59-202829 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792 and cyanine dyes described in British Patent 434,875.

Kindly replace the paragraph bridging pages 47 and 48, with the following: Further, near infrared absorption sensitizers described in U.S. Pat. No. 5,156,938 are also preferably used. In addition, substituted arylbenzo (thio) pyrylium salts described in U.S. Pat. No. 3,881,924, trimethinethiapyrylium salts described in JP-A-57-142645 (U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475 and pyrylium compounds described in JP-B-5-13514 and JP-B-5-19702 are also preferably used. Other preferred examples of the dyes include near infrared absorption dyes represented by formulas (I) and (II) in U.S. Pat. No. 4,756,993. Of these dyes, particularly preferred are cyanine dyes, squarylium dyes, pyrylium salts and nickel thiolate.

The pigments used in the invention are commercial pigments and pigments described in *Color Index* (*C. I.*) *Binran, Saishin Ganryo Binran* (edited by Nippon Ganryo Gijutsu Kyokai, 1977), *Saishin Ganryo Oyo Gijutsu* (CMC Shuppan, 1986) and *Insatsu Ink Gijutsu* (CMC Shuppan, 1984). As to the kind of pigment, there are black pigments, yellow pigments, orange pigments, brown pigments, red pigments, purple pigments, blue pigments, green pigments, fluorescent pigments, metal powder pigments and polymer binding dyes. Specifically, the dyes which can be used include insoluble pigments, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black of these pigments, preferred is carbon black.

These dyes and pigments can be used in an amount of 0.01% to 50% by weight, preferably 0.1% to 10% by weight, based on the total solid content of light-heat conversion material-containing layer. The dyes can be particularly preferably used in an amount of 0.5% to 10% by weight, and the pigments can be particularly preferably used in an amount of 3.1% to 10% by weight. When the amount of the pigments or dyes is less than 0.01% by weight, the sensitivity is lowered. On the other hand, exceeding 50% by weight results in the decreased film strength of the light-heat conversion material-containing layers.

(Support)

The support used under the under layer of the lithographic printing plate precursor of the invention is preferably a dimensionally stable tabular material. Examples thereof include paper, paper laminated with plastics (for example, polyethylene, polypropylene and polystyrene), plates of metals (for example, aluminum, zinc and copper), films of plastics (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonates and polyvinyl acetal), and paper or plastic films laminated or vapor deposited with the metals as described above. As the support used in the invention, the polyester film or the aluminum plate is preferred. Of these, the polyester film which can serve as the under layer is particularly preferred.

When the supports used in the lithographic printing plate precursors of the invention serve as the under layers, ones described above in detail for the under layers can be used. As described above, it is preferred that the surfaces of the supports with which the polymer compounds of the lithographic printing plate precursors of the invention are directly chemically combined are preferably roughened.

(Exposure Method)

For exposing the lithographic printing plate precursors using the photosensitive compositions of the invention, known methods can be used without limitation. That is to say, halogen lamps, mercury lamps, high pressure mercury lamps, intermediate pressure mercury lamps, low pressure mercury lamps and metal halide lamps can be used. Laser light sources desirably have a wavelength ranging from 350 nm to 1500 nm. The exposure mechanism may be any of the inner face drum system, the outer face drum system and the flat bed system.

In the case of a lithographic printing plate precursor exposure apparatus of the scanning exposure system, there is the inner face drum system, the outer face drum system or the flat bed system as the exposure mechanism. As the light source, a continuously oscillateable one of the above-mentioned light sources can be preferably used. Actually, the following exposure apparatus is particularly preferred in terms of the precursor sensitivity and the platemaking time.

(1) An exposure apparatus of the inner face drum system having a single beam to triple beams in which one or more semiconductor, gas or solid lasers are used so as to give a total output of 20 mW or more;

(2) An exposure apparatus of the flat bed system having multiple beams (1 to 10 beams) in which one or more semiconductor, gas or solid lasers are used so as to give a total output of 20 mW or more;

(3) An exposure apparatus of the outer face drum system having multiple beams (1 to 9 beams) in which one or more semiconductor, gas or solid lasers are used so as to give a total output of 20 mW or more; or (4) An exposure apparatus of the outer face drum system having multiple beams (10 or more beams) in which one or more semiconductor or solid lasers are used so as to give a total output of 20 mW or more; or (After-Heating)

In addition, a printing machine can be directly loaded with the lithographic printing plate precursor of the invention after exposure without development processing to conduct printing. It is also possible to load a printing machine with the printing plate precursor of the invention, and then to expose the precursor on the printing machine to conduct printing as such. However, the whole surface may be heated before exposure, during exposure or between exposure and development, as needed. Such heating enhances the image formation reaction in the photosensitive layer to provide the advantages of improved sensitivity and printing durability and stabilized sensitivity. The heating is preferably carried out under mild conditions of 150° C. or less. Too high temperature raises the problem that an image area is converted to a non-image area.

The invention will be further illustrated in greater detail with reference to the following examples, which are, however, not to be construed as limiting the invention.

EXAMPLE 1

Negative Lithographic Printing Plate Precursor A

A corona-treated polyethylene terephthalate film having a thickness of 188 μm was coated with the following composition using a coating bar of rod No. 10, and dried at 100° C. for 1 minute to prepare an under layer having a thickness of 1.6 μm.

| | |
|---|---|
| Epoxy Resin (Epikot, Yuka-Shell Co., Ltd.) | 2 g |
| Infrared Absorbing Agent (IR 125, manufactured by Wako Pure Chemical Industries, Ltd.) | 0.2 g |
| 1-Methoxy-2-propanol | 9 g |
| Methyl Ethyl Ketone | 9 g |

The resultant coating film was subjected to plasma treatment according to the following formulation. Using an LCVD-01 type plasma treatment apparatus manufactured by Shimadzu Corp., the film was treated under an Ar atmosphere of 0.04 torr for 10 seconds, and then exposed to air, thereby introducing peroxido groups onto a surface of the film. This film was immersed in a 10 wt % aqueous solution of Na α(styrene-4-sulfonyl) acetate. After bubbling of Ar gas for 15 minutes, the solution was heated at 60° C. for 7 hours, thereby conducting graft polymerization. After the graft polymerization, the film was dipped in 3,000 ml of ion-exchanged water to remove hamopolymers other than the graft polymer, thereby obtaining negative lithographic printing plate precursor A on a surface of which graft polymerization was performed by plasma treatment.

EXAMPLE 2

Negative Lithographic Printing Plate Precursor B

An under layer was prepared in the same manner as with Example 1 with the exception that carbon black (MHI Black manufactured by Mikuni Sikiso Co., Ltd.) was used as the light-heat conversion material. The thickness of the layer was 1.3 μm. Then, radicals were generated on a surface of the coating film with the following electron beam irradiation apparatus.

The coating film was subjected to electron beam irradiation using an electron accelerator (cascade type, IEA-300-25-2 manufactured by RDI, U.S.A.) at an acceleration voltage of 2.0 MV at an electron beam current of 1 mA in an atmosphere of nitrogen gas. For preventing the heat generation of the sample during irradiation, a conveyor was reciprocated at a speed of 2.3 m/minute. The dose rate was 10 kGy/pass, and the irradiation dose was 200 kGy.

Then, the electron beam-irradiated film was immersed in a 10 wt % aqueous solution of Na α(styrene-4-sulfonyl) acetate, and the solution was heated at 40° C. for 10 hours, thereby conducting graft polymerization. The resulting graft-polymerized film was dipped in 5,000 ml of ion-exchanged water to remove homopolymers other than the graft polymer, thereby obtaining negative lithographic printing plate precursor B on a surface of which graft polymerization was performed by electron beam irradiation.

EXAMPLE 3

Lithographic Printing Plate Precursor C

Radicals were generated on a surface of a polyethylene film with the electron beam irradiation apparatus in the same manner as with Example 2, with the exception that the low-density polyethylene film having a thickness of 200 μm (manufactured by Asahi Chemical Industry Co., Ltd.) was used as an under layer (also serving as a substrate).

Then, 3,000 ml of a 10 wt % solution of 1-methoxy-2-propanol styrene-4-sulfonate in methyl ethyl ketone was placed in a separable flask, and Ar gas was bubbled therethrough for 30 minutes. Thereafter, the polyethylene film obtained above by electron beam irradiation was immersed in this solution, and the solution was heated at 40° C. for 15 hours, thereby conducting graft polymerization. The resulting graft-polymerized film was dipped in 5,000 ml of methyl ethyl ketone to remove homopolymers other than the graft polymer, thereby obtaining positive lithographic printing plate precursor C on a surface of which graft polymerization was performed by electron beam irradiation.

EXAMPLE 4

Lithographic Printing Plate Precursor D

Positive lithographic printing plate precursor D was obtained in the same manner as with Example 3 with the exception that 1-methoxy-2-propanol styrene-4-sulfonate was replaced by 2-ethoxyethyl acrylate (A-EE, manufactured by Shin Nakamura Kagaku Co., Ltd).

EXAMPLE 5

Lithographic Printing Plate Precursor E

Radicals were generated on a surface of a hardening type hydrophilic polymer film with the electron beam irradiation apparatus in the same manner as with Example 2, with the exception that the following hardening type hydrophilic polymer layer was used as an under layer.

Preparation of Under Layer:

Production of Hydrophilic Polymer

In dimethylacetamide, 18.0 g of polyacrylic acid having a molecular weight of 25,000 (manufactured by Wako Pure Chemical Industries Ltd.) was dissolved, and 5.5 g of 2-methacryloyloxyethyl isocyanate (hereinafter referred to as MOI for brevity) and 0.1 g of dibutyltin dilaurate were added thereto, followed by reaction for 3 hours. Then, 80 equivalent percent of carboxyl groups were partially neutralized with sodium hydroxide, and acetone was added thereto to precipitate a polymer, which was thoroughly washed to purify it, thus obtaining hydrophilic polymer P-1.

Then, 1.0 g of hydrophilic polymer P-1 described above, 0.1 g of water-soluble triazine initiator A having the following structure and 0.1 g of light-heat conversion dye B having the following structure were dissolved in 20 g of water. The resulting solution was applied onto a corona-treated PET film having a thickness of 200 μm with a wire bar 14, and dried at 100° C. for 1 minute. The whole surface thereof is exposed to UV light at 1,000 counts (an Ai rotary printer, manufactured by Ai Graphic Co., Ltd.) to obtain a crosslinked hydrophilic layer. The thickness of the hydrophilic layer was 3.5 μm.

Structure of Water-Soluble Triazine Initiator A

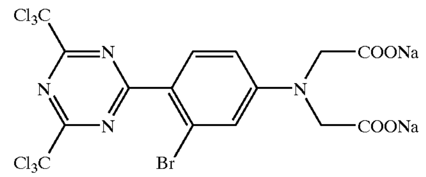

Structure of Light-Heat Conversion Dye B

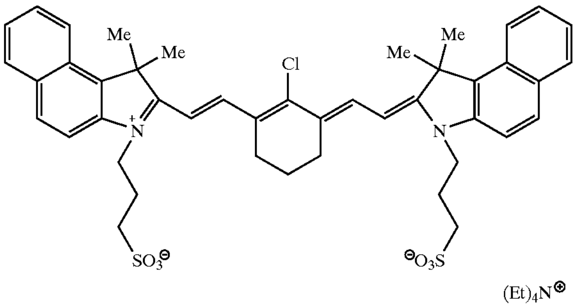

Then, radicals were generated on a surface of the hydrophilic polymer by electron beam irradiation in the same manner as with Example 3, and graft polymerization was conducted using 1-methoxy-2-propanol styrene-4-sulfonate in the same manner as with Example 3 to obtain positive lithographic printing plate precursor E on a surface of which graft polymerization was performed by electron beam irradiation.

EXAMPLE 6

Lithographic Printing Plate Precursor F

Using a 188-μm thick biaxially stretched polyethylene terephthalate film (A4100, manufactured by Toyobo Co., Ltd.) was used as an under layer (also serving as a substrate) and using a lithographic magnetron spattering apparatus (CFS-10-EP70, manufactured by Shibaura Eletec Corporation) for glow treatment, oxygen glow treatment was carried out under the following conditions:

Initial vacuum pressure: $9\times10^6$ torr

Oxygen pressure: $6.8\times10^3$ torr

RF glow: 1.5 kw

Treating time: 60 seconds

Then, glow-treated film was immersed in a 50 wt % solution of 1-methoxy-2-propanol styrene-4-sulfonate (M-5) in methyl ethyl ketone, and the solution was heated at 60° C. for 4 hours, thereby conducting graft polymerization, Thus, positive lithographic printing plate precursor F was obtained on a surface of which graft polymerization was performed by electron beam irradiation.

Lithographic printing plate precursors Ai B and E thus obtained were exposed using an IR laser (beam diameter: 20 μm) emitting an infrared light having a wavelength of 830 nm. After exposure, printing was usually conducted using a Lithron printing machine. In this case, it was observed whether image areas of printed matter were well formed or not, and whether scumming was developed on non-image areas or not. Further, laser scanning areas of the resulting lithographic printing plates were observed, and the resulting line widths were measured, thereby estimating the sensitivity. A line width closer to a beam diameter of 20 μm indicates higher sensitivity. Results thereof are shown in Table 1.

Further, lithographic printing plate precursors C, D and F were printed with a thermal head using a word processor (SHOIN, manufactured by Sharp Corp.), and evaluated using the printing machine used in printing of lithographic printing plate precursors A, B and E, Results thereof are shown in Table 1.

TABLE 1

| Example | Heat-Sensitive Lithographic Printing Plate Precursor | Blurring on Image Area | Scumming on Non-Image Area | Sensitivity (μ) |
|---|---|---|---|---|
| 1 | A | Not observed | Not observed | 20 |
| 2 | B | " | " | 19 |
| 3 | C | " | " | |
| 4 | D | " | " | |
| 5 | E | " | " | 20 |
| 6 | F | " | " | |

All of lithographic printing plate precursors A to F each provided 10,000 sheets of good printed matter, and showed no blurring on image area and no scumming on non-image area. Further, all of lithographic printing plate precursors A, B and E each had good sensitivity.

Irregular Surface Supports 1 to 5

(Support Example 1)

A 188-μm thick sand-blasted PET film having a surface roughness (center line average height) Ra of 0.7 μm and a maximum height Ry of 7 μm (manufactured by Panac Kogyo Co., Ltd.)

(Support Example 2)

A 188-μm thick PET film containing 3.5% by weight of silica having an average particle size of 1.2 μm and having a center line average height of 0.18 μm (Support Example 3)

A 188-μm thick PET film containing 1.0% by weight of alumina having an average particle size of 3.5 μm ad having a center line average height of 0.28 μm (Support Examples 4 and 5)

188-μm thick sand-blasted PET films each having two-dimensional surface roughness shown in Table 2

TABLE 2

| Parameter | Support Example 4 Tracer Method, Two-Dimensional (μm) | Support Example 5 Tracer Method, Two-Dimensional (μm) |
|---|---|---|
| Ra | 0.21 | 0.31 |
| Ry | 1.85 | 2.9 |
| Rz | 1.54 | 2.3 |
| Sm | 19 | 19 |
| S | 13 | 13 |
| Rt | 1.9 | 2.9 |
| Rp | 1.4 | 1.5 |
| Rv | 3.1 | 3.5 |

The above-mentioned surface roughness parameters were measured with a tracer type surface roughness tester. The tip diameter of the tracer was 2 μmR.

EXAMPLES 7 to 16

(Preparation of Positive Lithographic Printing Plate Precursors 7 to 16)

The above-mentioned irregular surface supports 1 to 5 were used as supports. Each support was immersed in the following photochemical graft polymerization solution placed in a pyrex vessel. Then, the inside of the vessel was replaced with Ar gas, and the support was irradiated with light for 60 minutes using a 400-W high-pressure mercury lamp (UVL-400P, manufactured by Riko Kagaku Sangyo Co., Ltd.) 10 cm apart from the vessel. The resulting film was immersed in acetone for 30 minutes to remove a polymer on a surface of which no monomer was grafted, thereby obtaining a PET film on an irregular surface of which a monomer changeable from hydrophobic to hydrophilic in polarity was grafted. Then, the PET film was immersed in an infrared absorption dye solution (the following composition) for 30 seconds, followed by drying at 70° C. for 1 minute. Thus, positive lithographic printing plate precursors 7 to 16 containing the IR dye in graft layers and sensitive to infrared lasers were obtained.

(Photochemical Graft Polymerization Solution A)

1-Methoxy-2-propanol styrene-4-sulfonate: 100 g, 1-methoxy-2-propanol: 100 g, and benzophenone: 4.5 g.

(Photochemical Graft Polymerization Solution B)

Tetrahydropyranyl acrylate (A-THP, manufactured by Shin Nakamura Kagaku Co., Ltd): 100 g, 1-methoxy-2-propanol: 100 g, and benzophenone: 4.5 g.

(Infrared Absorption Dye Solution)

Infrared absorption dye (IR 125, Wako Pure Chemical industries, Ltd.), 1-mathoxy-2-propanol: 9 g, and methyl ethyl ketone; 9 g.

Lithographic printing plate precursors 7 to 16 thus obtained were exposed using an IR laser (beam diameter: 20 μm) emitting an infrared light having a wavelength of 830 nm. After exposure, printing was usually conducted using a Lithron printing machine without any development processing. In this case, it was observed whether image areas of printed matter were well formed or not, and whether scumming was developed on non-image areas or not. Results thereof are shown in Table 3.

All of lithographic printing plate precursors 7 to 16 each provided 20,000 sheets of good printed matter, and showed no blurring on image areas and no scumming on non-image areas.

EXAMPLES 17 AND 18

(Preparation of Positive Lithographic Printing Plate Precursors 17 and 18)

The above-mentioned irregular surface supports 1 and 2 were used as supports. Photochemical graft polymerization was employed for the graft reaction to surfaces of the films, and the photoreaction was conducted in the same manner as with Examples 7 to 17, thereby obtaining a PET film on an irregular surface of which a monomer changeable from hydrophobic to hydrophilic in polarity was grafted. As photochemical graft polymerization solution C, a solution having the following composition was used.

(Photochemical Graft Polymerization Solution C)

Na α(styrene-4-sulfonyl)acetate: 10 g, water: 100 g, and riboflavin (manufactured by Wako Pure Chemical Industries Ltd.): 0.01 g.

Lithographic printing plate precursors 17 and 18 thus obtained were printed with a thermal head using a word processor (SHOIN, manufactured by Sharp Corp.), and evaluated using the printing machine used in printing of lithographic printing plate precursors 7 to 16. Results thereof are shown in Table 3.

TABLE 3

| Example | Printing Plate Precursor | Polymerization Solution | Support | Results of Printing |
|---|---|---|---|---|
| 7 | 7 | A | 1 | No Scumming |
| 8 | 8 | A | 2 | " |
| 9 | 9 | A | 3 | " |
| 10 | 10 | A | 4 | " |
| 11 | 11 | A | 5 | " |
| 12 | 12 | B | 1 | " |
| 13 | 13 | B | 2 | " |
| 14 | 14 | B | 3 | " |
| 15 | 15 | B | 4 | " |
| 16 | 16 | B | 5 | " |
| 17 | 17 | C | 1 | " |
| 18 | 18 | C | 2 | " |

All of lithographic printing plate precursors 7 to 18 each provided 20,000 sheets of good printed matter, and showed no blurring on image areas and no scumming on non-image areas. Further, all of lithographic printing plate precursors 7 to 18 each had good sensitivity.

EXAMPLE 19

Preparation of Lithographic Printing Plate Precursor (Preparation of Photosensitive Layer)

Using a 188-μm thick biaxially stretched polyethylene terephthalate film (A4100, manufactured by Toyobo Co., Ltd.) as a surface layer of a support (the surface also serves as the support) and using a lithographic magnetron spattering apparatus (CFS-10-EP70, manufactured by Shibaura Eletec Corporation) for glow treatment, argon glow treatment was carried out under the following conditions:

(Conditions of Argon Glow Treatment)

Initial vacuum pressure: $1.2\times10^{-3}$ Pa

Argon pressure: 0.9 Pa

RF glow: 1.5 kw

Treating time: 60 seconds

Then, glow-treated film was immersed in a 10 wt % solution of 2-ethoxyethyl acrylate (A-EE, manufactured by Shin Nakamura Kagaku Co., Ltd) in methyl ethyl ketone at 50° C. for 7 hours, thereby conducting surface graft polymerization. The resulting film was immersed and washed in acetone for 8 hours to remove polymers not grafted, thereby obtaining a polymer layer on a surface of which 2-ethoxyethyl acrylate was grafted.

Then, the polymer layer was immersed in a 10 wt % solution of 2,6-bistrichloromethyl-4-(p-(N,N-di (ethoxycarbonylmethyl)-amino)phenyl)triazine in methyl ethyl ketone as a photo acid generator for 5 minutes to obtain a photosensitive printing plate precursor.

(Evaluation of Printing)

Using an InGaN semiconductor laser having an oscillation wavelength of 400 nm, the resulting lithographic printing plate precursor was subjected to scanning exposure under such conditions that a beam diameter of 25 μm is given on a surface of the precursor, and that an exposure energy density of 0.2 mJ/cm$^2$ is obtained. Then, the resulting precursor was subjected to offset printing without any development, using a KOR-D printing machine manufactured by Heidelberg Co. As a result, 50,000 or more sheets of printed matter excellent in image density and scumming resistance were obtained.

EXAMPLES 20 TO 23

Photosensitive lithographic printing plate precursors were prepared, exposed and developed, and the printing property was evaluated, in the same manner as with Example 1 with the exception that monomers shown in Table 4 wide used. Results of evaluation are shown in Table 4.

TABLE 4

| Example | Monomer | Printing Property (scumming resistance in 9,000 sheets) |
|---|---|---|
| 20 | M-8 | No scumming |
| 21 | M-13 | " |
| 22 | M-14 | " |
| 23 | M-15 | " |

(Note) M-8: t-butyl methacrylate

All the lithographic printing plate precursors of the respective examples according to the invention provided 9,000 sheets of good printed matter having no scumming on non-image areas, thus achieving satisfactory results.

The lithographic printing plate precursors of the invention can form images at high sensitivity by heating or heat developed by light-heat conversion, can directly make plates from digital data by recording using lasers emitting infrared light or various thermal heads of simple compact heat-sensitive printers or facsimiles, have good sensitivity, require no special processing such as wet development processing or rubbing after image exposure, are sharp in printed images, are excellent in printing durability, and significantly improved in scumming resistance. Accordingly, the lithographic printing plate precursors of the invention have extremely high utility.

What is claimed is:

1. A lithographic printing plate precursor comprising a polymer compound having a functional group changeable from hydrophobic to hydrophilic by heat, acid or radiation and an under layer with which the polymer compound is combined, wherein the polymer compound is directly combined with a surface of the under layer by chemical bonding.

2. The lithographic printing plate precursor according to claim 1, wherein the polymer compound is combined with the under layer by covalent bonding.

3. A lithographic printing plate precursor comprising a polymer compound having a functional group changeable from hydrophobic to hydrophilic by heat, acid or radiation and an under layer with which the polymer compound is combined, wherein the polymer compound is a straight-chain polymer compound directly combined at an end of a polymer chain thereof with a surface of the under layer by chemical bonding, or the polymer compound comprises (i) a polymer backbone chemically combined with a surface of the under layer and (ii) a straight-chain polymer compound combined at an end of a polymer chain thereof with the polymer backbone and having a functional group changeable in hydrophilicity.

4. A lithographic printing plate precursor comprising a support having provided thereon a photosensitive layer containing at least a photo acid generator and a polymer compound having a functional group changeable in hydrophilicity by acid, the polymer compound being directly chemically combined with a surface of the support.

5. The lithographic printing plate precursor according to claim 4, wherein the polymer compound is combined with the support by covalent bonding.

6. The lithographic printing plate precursor according to claim 4, wherein the polymer compound is a straight-chain polymer compound directly chemically combined at an end of a polymer chain thereof with the surface of the support, or the polymer compound comprises (i) a polymer backbone chemically combined with the surface of the support and (ii) a straight-chain polymer compound combined at an end of a polymer chain thereof with the polymer backbone and having a functional group changeable in hydrophilicity.

7. The lithographic printing plate precursor according to claim 4, wherein the polymer compound is a polymer compound comprising a side chain having a functional group changeable from hydrophobic to hydrophilic by acid.

8. A lithographic printing plate precursor comprising a polymer compound having a functional group changeable from hydrophilic to hydrophobic by heat, acid or radiation and an under layer with which the polymer compound is combined, wherein the polymer compound is directly combined with a surface of the under layer by chemical bonding and wherein the functional group is general formula (3) as follows:

(3)

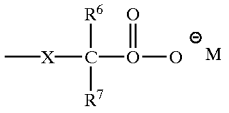

wherein X represents —O—, —S—, —Se—, —$NR^8$—, —CO—, —SO—, —$SO_2$—, —PO—, —$SiR^8R^9$— or —CS—, $R^6$, $R^7$, $R^8$ and $R^9$ each independently represents a monvalent group, M represents an ion having a positive charge.

* * * * *